United States Patent
Johnson et al.

(10) Patent No.: US 9,341,649 B1
(45) Date of Patent: May 17, 2016

(54) ON-CENTER ELECTRICALLY CONDUCTIVE PINS FOR INTEGRATED TESTING

(71) Applicant: Johnstech International Corporation, Minneapolis, MN (US)

(72) Inventors: David Johnson, Wayzata, MN (US); John Nelson, Brooklyn Park, MN (US); Sarosh Patel, Sunnyvale, CA (US); Michael Andres, Inver Grove Heights, MN (US)

(73) Assignee: Johnstech International Corporation, Minneapolis, MN (US)

( * ) Notice: Subject to any disclaimer, the term of this patent is extended or adjusted under 35 U.S.C. 154(b) by 34 days.

(21) Appl. No.: 14/212,168

(22) Filed: Mar. 14, 2014

Related U.S. Application Data

(60) Provisional application No. 61/791,354, filed on Mar. 15, 2013, provisional application No. 61/845,000, filed on Jul. 11, 2013, provisional application No. 61/909,441, filed on Nov. 27, 2013.

(51) Int. Cl.
  *G01R 31/00* (2006.01)
  *G01R 1/073* (2006.01)
(52) U.S. Cl.
  CPC .................. *G01R 1/07307* (2013.01)

(58) Field of Classification Search
  None
  See application file for complete search history.

(56) References Cited

U.S. PATENT DOCUMENTS

| | | | |
|---|---|---|---|
| 7,537,461 B2 * | 5/2009 | Rathburn | H01R 13/2414 439/66 |
| 7,918,669 B1 | 4/2011 | Tiengtum | |
| 2002/0197891 A1 | 12/2002 | Suematsu | |
| 2006/0121752 A1 | 6/2006 | Sakiyama | |
| 2009/0042415 A1 | 2/2009 | Nakamura | |
| 2009/0075495 A1 * | 3/2009 | Kim et al. | 439/65 |
| 2010/0029100 A1 * | 2/2010 | Ichimura et al. | 439/66 |

OTHER PUBLICATIONS

International Search Report for PCT International Application No. PCT/US2014/46248 dated Dec. 17, 2014.

\* cited by examiner

*Primary Examiner* — Paresh Patel
(74) *Attorney, Agent, or Firm* — Altera Law Group, LLC

(57) ABSTRACT

A structure and method for providing a contact pin between a device under test (DUT) and a load board which provides upper and lower contact point which are axial aligned is disclosed. The pin has an upper (30) and lower (32) section and a hinge (44/46) in between which allow flex of both upper and lower contact (24/26) which, but the axial alignment can provide a direct replacement for POGO pins but with greater reliability.

5 Claims, 21 Drawing Sheets

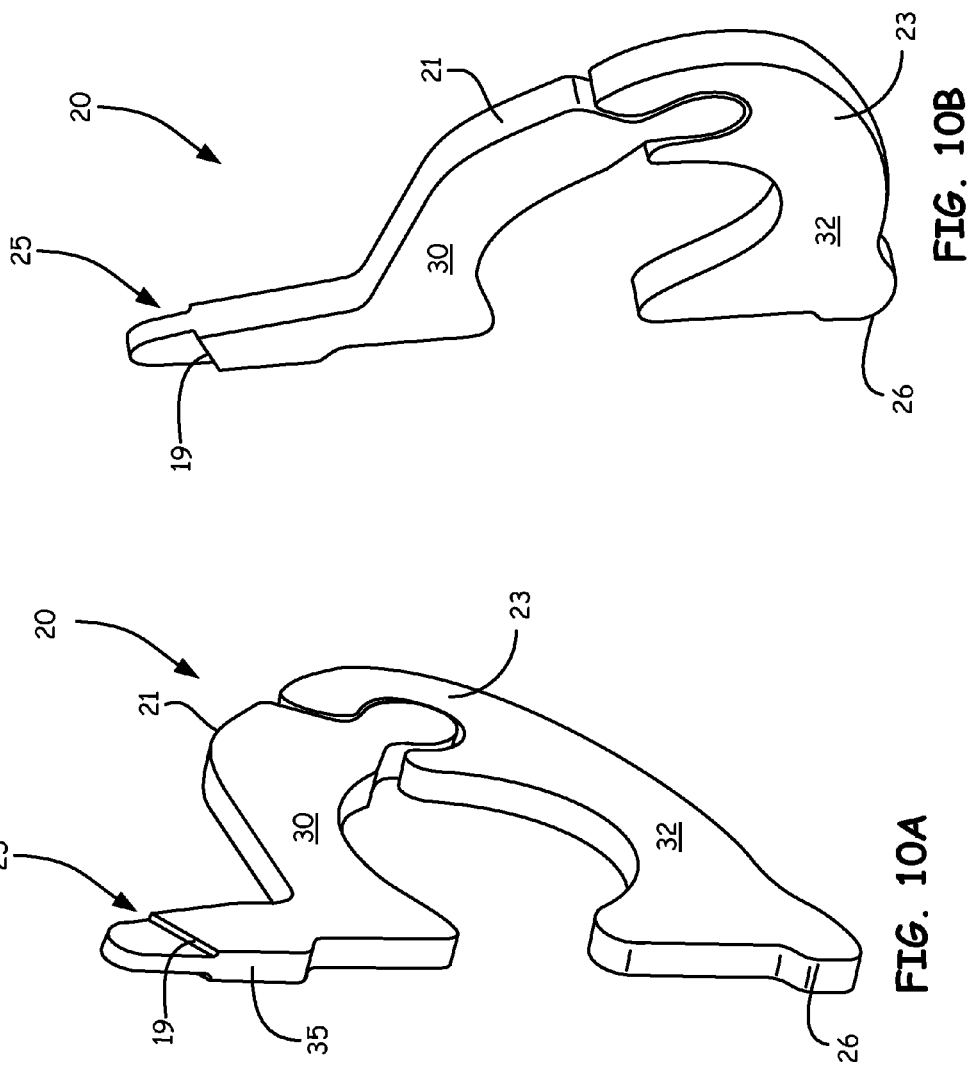

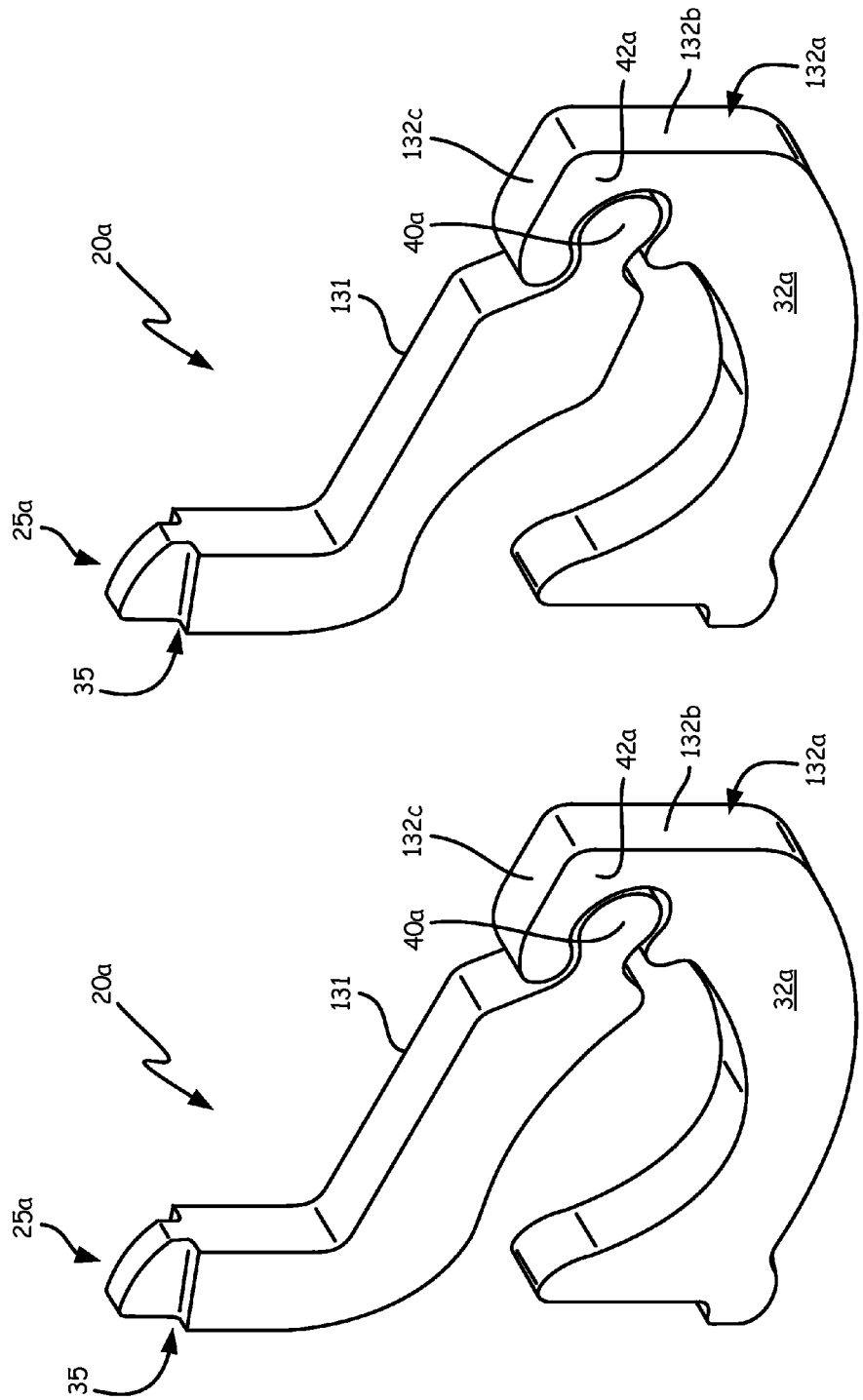

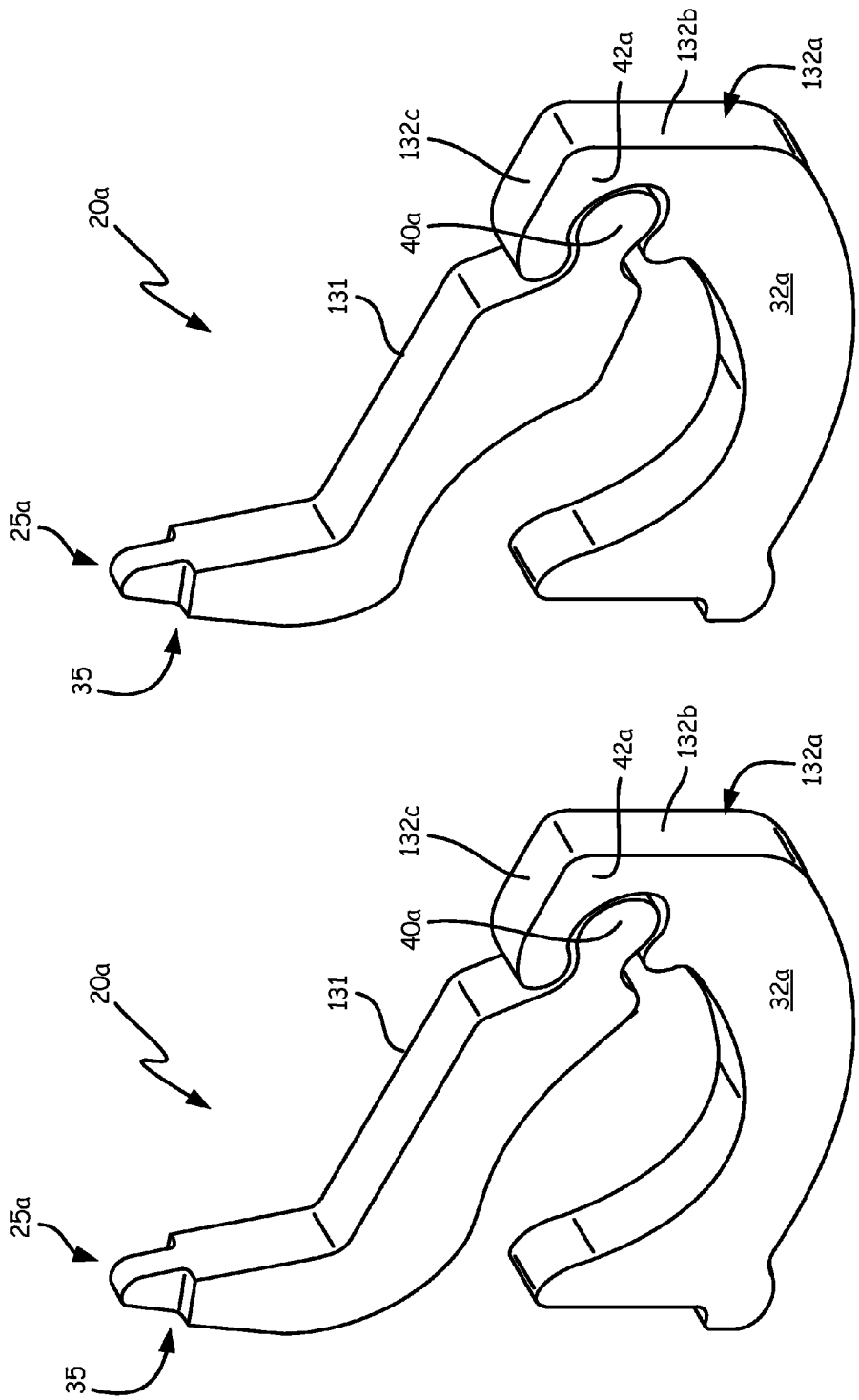

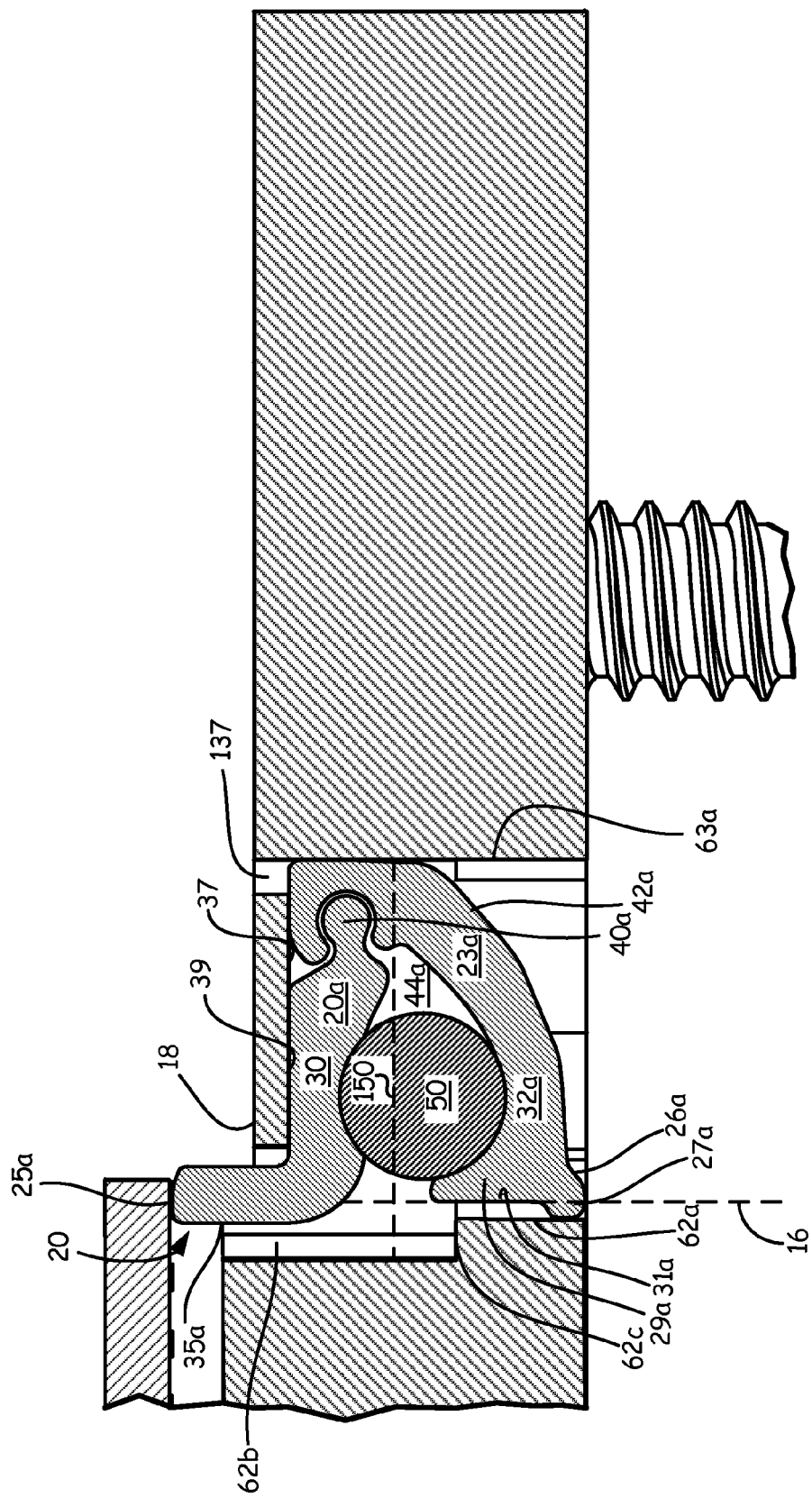

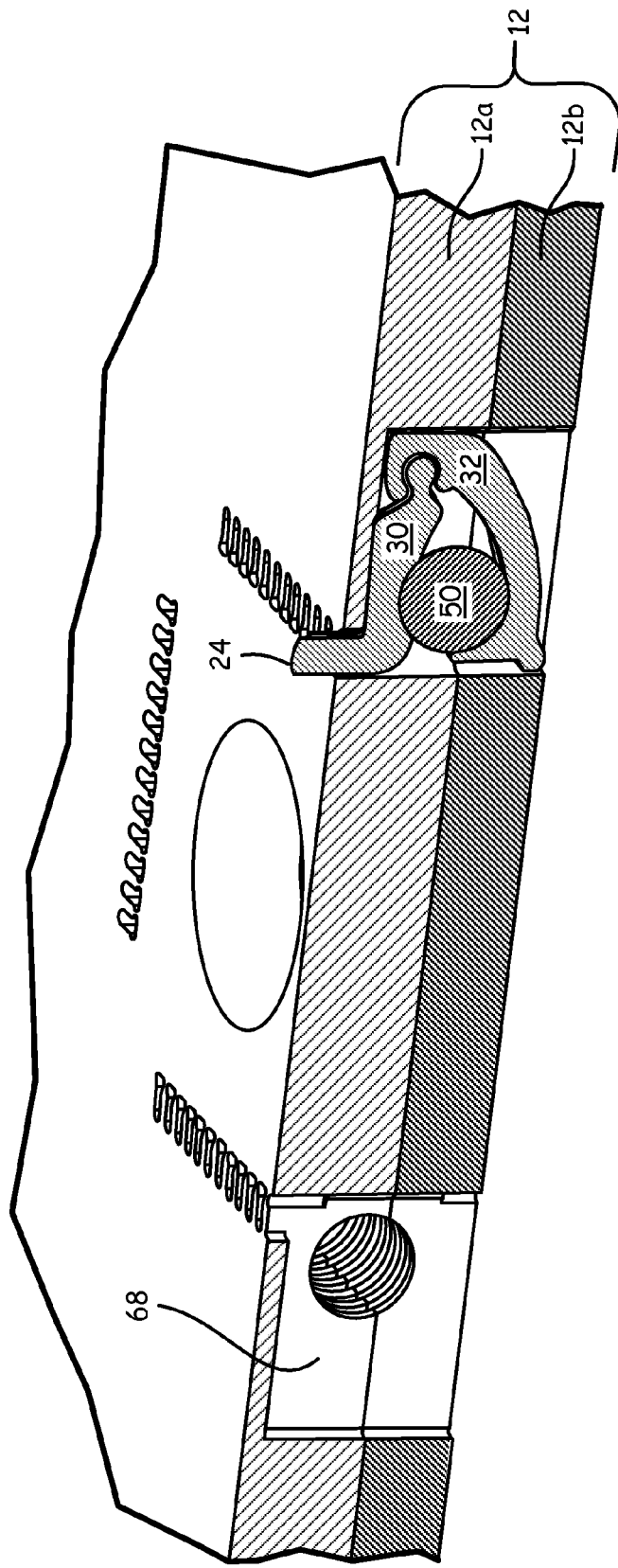

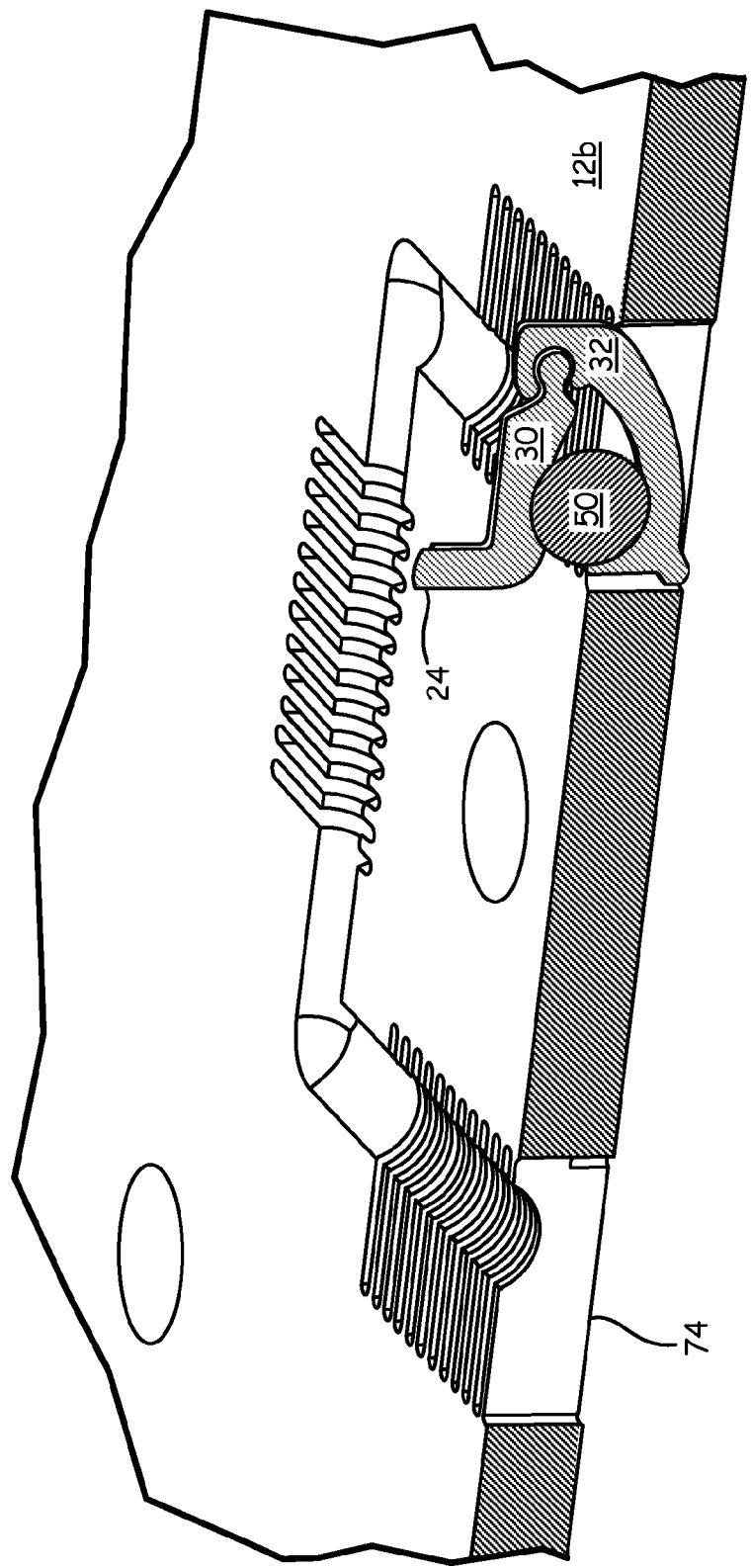

ON-CENTER ELECTRICALLY CONDUCTIVE PINS FOR INTEGRATED TESTING

CROSS-REFERENCE TO RELATED APPLICATIONS

This application claims priority and incorporates by reference the disclosure of provisional application No. 61/791,354, filed on Mar. 15, 2013, entitled On Center Articulating Contact for Single and Dual Elastomer; Ser. No. 61/845,000 filed 11 Jul. 2013 entitled: On-Center Electrically Conductive Pins For Microcircuit Testing; and provisional Ser. No. 61/909,441 filed 27 Nov. 2013 entitled On-Center Electrically Conductive Pins For Microcircuit Testing. In also incorporates by reference: U.S. Pat. No. 7,338,293 to Gilk and U.S. Pat. No. 7,639,026 as background.

BACKGROUND

1. Field of the Disclosure

The present disclosure is directed to equipment for testing integrated circuits and semiconductors.

2. Description of the Related Art

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself.

A further problem in microcircuit test equipment arises in automated testing. Testing equipment may test 100 devices a minute, or even more. The sheer number of tests cause wear on the tester contacts making electrical connections to the microcircuit terminals during testing. This wear dislodges conductive debris from both the tester contacts and the DUT terminals that contaminates the testing equipment and the DUTs themselves.

The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Test equipment in current use has an array of test contacts that mimic the pattern of the microcircuit terminal array. The array of test contacts is supported in a structure that precisely maintains the alignment of the contacts relative to each other. An alignment template or board aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

For the electrical tests, it is desired to form a temporary electrical connection between each terminal on the device under test and a corresponding electrical pad on a load board. In general, it is impractical to solder and remove each electrical terminal on the microcircuit being contacted by a corresponding electrical probe on the testbed. Instead of soldering and removing each terminal, the tester may employ a series of electrically conductive pins arranged in a pattern that corresponds to both the terminals on the device under test and the electrical pads on the load board. When the device under test is forced into contact with the tester, the pins complete the circuits between respective device under test contacts and corresponding load board pads. After testing, when the device under test is released, the terminals separate from the pins and the circuits are broken.

Other considerations exist as well. The test contacts must make connection between the DUT and a load board, the board which carries the test signals to and from the contact pins. A common type of test pin is known as the spring loaded test pin or POGO pin, as it resembles a pogo stick toy. An example of such a pin arrangement is shown in US publication US 2011/0102009 to Lee. It illustrates the axial shaft alignment of the pad to be contacted on the DUT, the pogo pin and the pad on load board. By virtue of the fact that the pogo pin follows a linear axial path, makes the relationship between pads on the load board and on the DUT very simple.

Pogo pins have however many technical deficiencies, such as limitations in frequency response, current carrying capabilities, resistance, noise and high failure rates.

A solution has long been needed to provide pins with improved capabilities but which can be retrofitted to load boards with preexisting pad layouts to avoid the needs to replace expensive load boards to accommodate superior pin designs such as pins disclosed in U.S. Pat. No. 7,338,293 to Gilk and U.S. Pat. No. 7,639,026 to Shell. An alternative structure with a single part pin hinged to a sidewall is shown in U.S. Pat. No. 7,918,669 to Tiengtum.

The present disclosure is directed to improvements to these pins and structures surrounding them to solve this and other problems.

BRIEF SUMMARY

The summary below is not intended to define the scope of invention but provide a convenient way for the reader to understand some of the concepts in the entire document.

Amongst other things, there is disclosed a socket for making electrical connection between an integrated circuit device under test (DUT) having a plurality of contacts and a load board having a plurality of contact pads so that a signal may be transmitted therebetween wherein said contact and its corresponding pad are generally vertically aligned along a contact axis, having any or all of the following features:

a. a pin guide having a top and bottom, said guide being interposed between said contacts and said pads and including a plurality of spaced apart insulating and separating plates thereby defining a plurality of slots for receiving pin pairs; with said slots being generally at least partially axially aligned along said contact axis; said guide further including a longitudinal bore substantially orthogonal to said axis and extending through at least some of said plates thereby creating a cavity for an elastomer;

b. an elongated elastomer sized to be received within said bore;

c. a multi-piece pin pair including:
  1. a first upper pin leg having a contact tip at its distal end, an upper body portion extending from said tip and a upper hinge part at its proximal end;
  2. a second lower pin leg having a load board pad contact portion at its distal end, a lower hinge part at its proximal end, and a lower body portion extending from said pad contact portion to said hinge part;
  3. said hinge parts being hingeably joined to make a rotational and electrical pivotable link contact therebetween,
  4. said upper body portion including curved inner periphery shaped to engage said elastomer;
  5. said lower body portion including a curved inner periphery shaped to engage said elastomer;

so that said legs surrounds, at least in part, said elastomer when in said pin guide said contact tip and said load board pad contact on said pin pair being generally in axial alignment with axis while said upper and lower body portions of said pin pairs are at least partially out of alignment with said axis, when said legs are contained within said slot.

There is also disclosed a method of providing a resilient electrical contact between a device under test (DUT) having leads/pads and a load board with contact pads, said contacts and pads being aligned along an axis; and including a conductive pin pair having an upper leg with a tip, and a lower leg with a leg contact, each leg having body portion and a part of a hinge; comprising any or all of the following steps in any order:

a. locating the pin pair between said contacts and pads, with said pin said tip and leg contact in alignment with said axis;
b. locating a portion of the said body portions offset from said axis;
c. locating said hinge offset from said axis;
d. biasing said legs apart from each other so that the top and leg contact achieve electrical contact with said DUT and load board.

BRIEF DESCRIPTION OF THE SEVERAL VIEWS OF THE DRAWINGS

FIGS. 10A and 10B are perspective views of a pin pair.
FIGS. 11A, 11B, 11C and 11D are perspective like FIGS. 10A-10B but for an alternate embodiment of a pin pair.
FIGS. 13A, 13B, 13C and 13D are perspective views like FIGS. 11A-11B but for a further pin pair embodiment with alternate contact tips.
FIG. 15 is a side plan view like FIG. 4 except directed the embodiment in FIG. 13A.
FIG. 18 is a view like FIG. 8 except directed to the embodiment shown in FIGS. 11 and 13.
FIG. 19 is a view like FIG. 9 except directed to the embodiments shown in FIGS. 11 and 13.

DETAILED DESCRIPTION

Figure 1:
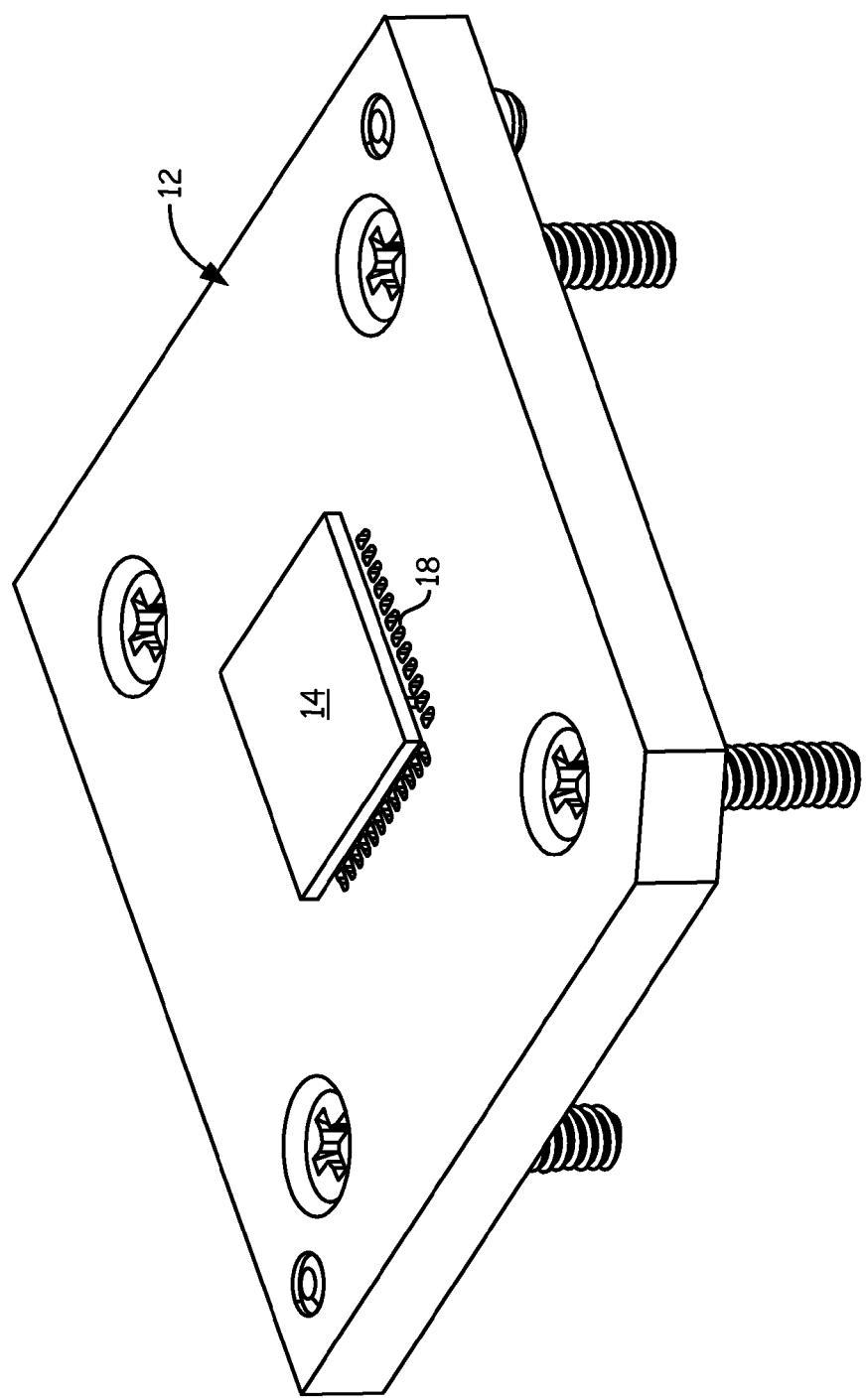
FIG. 1 is a top perspective view of a test system.

Consider an electrical chip that is manufactured to be incorporated into a larger system. When in use, the chip electrically connects the device to the larger system by a series of pins or terminals. For instance, the pins on the electrical chip may plug into corresponding sockets in a computer, so that the computer circuitry may electrically connect with the chip circuitry in a predetermined manner. An example of such a chip may be a memory card or processor for a computer, each of which may be insertable into a particular slot or socket that makes one or more electrical connections with the chip.

It is highly desirable to test these chips before they are shipped, or before they are installed into other systems. Such component-level testing may help diagnose problems in the manufacturing process, and may help improve system-level yields for systems that incorporate the chips. Therefore, sophisticated test systems have been developed to ensure that the circuitry in the chip performs as designed. The chip is attached to the tester or test socket, as a "device under test", is tested, and is then detached from the tester. In general, it is desirable to perform the attachment, testing, and detachment as rapidly as possible, so that the throughput of the tester may be as high as possible.

The test systems access the chip circuitry through the same pins or terminals that will later be used to connect the chip in its final application. As a result, there are some general requirements for the test system that perform the testing. In general, the tester should establish electrical contact with the various pins or terminals so that the pins are not damaged, and so that a reliable electrical connection is made with each pin.

Most testers of this type use mechanical contacts between the chip pins and the tester contacts, rather than soldering and de-soldering or some other attachment method. When the chip is attached to the tester, each pin on the chip is brought into mechanical and electrical contact with a corresponding pad on the tester. After testing, the chip is removed from the tester, and the mechanical and electrical contacts are broken.

In general, it is highly desirable that the chip and the tester both undergo as little damage as possible during the attachment, testing, and detachment procedures. Pad layouts on the tester may be designed to reduce or minimize wear or damage to the chip pins. For instance, it may be desirable to scrape the device I/O (leads, pins, pads or balls), bend or deflect the I/O, to remove oxide but without damaging the pins. Typically, the testers are designed to leave the chips in a final state that resembles the initial state as closely as possible. In addition, it is also desirable to avoid or reduce any permanent damage to the tester or tester pads, so that tester parts may last longer before replacement.

For low-frequency testing, such as done close to DC (0 Hz), the electrical performance may be handled rather simplistically: one would want an infinitely high resistance when the chip is detached, and an infinitesimally small resistance when the chip is attached.

At higher frequencies, other electrical properties come into play, beyond just resistance. Impedance (or, basically, resistance as a function of frequency) becomes a more proper measure of electrical performance at these higher frequencies. Impedance may include phase effects as well as amplitude effects, and can also incorporate and mathematically describe the effects of resistance, capacitance and inductance in the electrical path. In general, it is desirable that the contact resistance in the electrical path formed between the chip I/O and the corresponding pad on the load card be sufficiently low, which maintains a target impedance of 50 ohms, so that the tester itself does not significantly distort the electrical performance of the chip under test. Note that most test equipment is designed to have 50 ohm input and output impedances.

For modern-day chips that have many, many closely spaced I/O, it becomes helpful to simulate the electrical and mechanical performance at the device I/O interface. Finite-element modeling in two- or three dimensions has become a tool of choice for many designers.

A general summary of the disclosure follows.

A solution to the above mentioned problem with pogo pins which maintains the axial alignment between the load board and DUT contacts is to provide a multi-part articulating pin pair which has an upper pin top and a lower pin pad contact in axial alignment with the load board and DUT contacts, but other parts of the pin may extend outside that axis. By creating this offset for the remaining parts of the pin and bias mechanism, the axial alignment can be maintained but the reliability of the pin can be greatly enhanced because the entire pin does not have to be confined to the limited tubular space available to a pogo pin. This permits this new structure to be more robust, more reliable, than pogo pins, yet still be used on load boards made for such pogo pins.

The terminals of a device under test are temporarily electrically connected to corresponding contact pads on a load board by a series of electrically conductive pin pairs having first and second legs joined by an electrically conductive hinge. The legs are biased into contact, or preloaded, with their respective contact pads by an elastomer which engages both legs. In the preferred embodiment the bulk of the pin structure is actually outside of the axis 16 (defined from the DUT contact to the corresponding load board contact pad).

Figure 2:
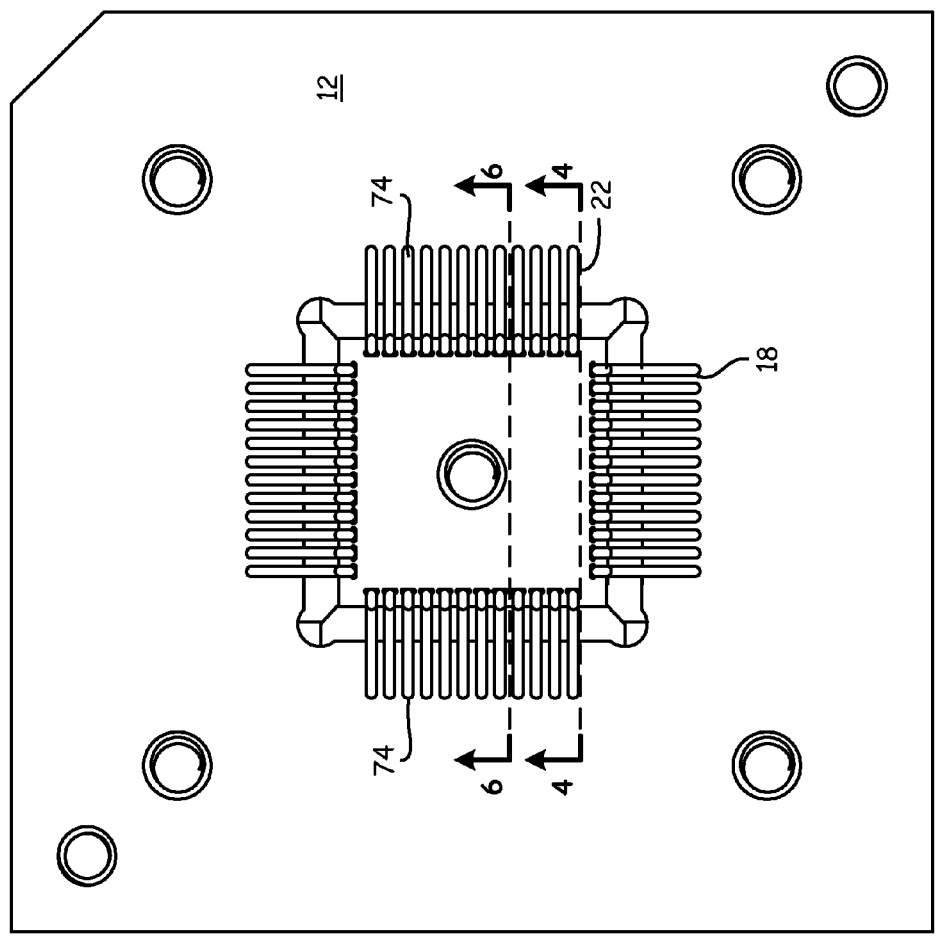
FIG. 2 is a bottom plan view showing a portion of one test pin pair.
Figure 3:
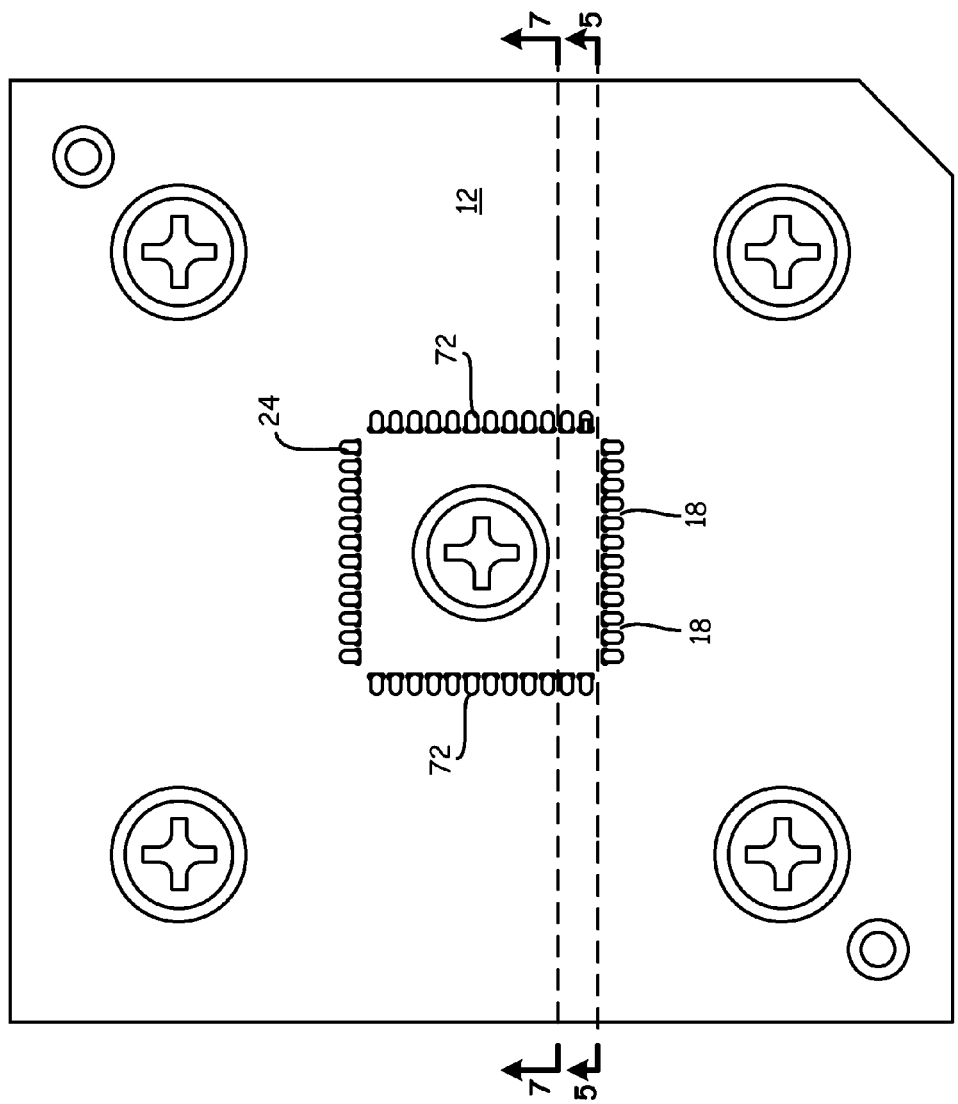
FIG. 3 is a top plan view showing a portion of one test pin pair.

Turning to the figures, FIGS. 1, 2 and 3 illustrate various views of a pin guide or housing 12 which is interposed between a load board (not shown but described in the above cited incorporated references) and a device under test (DUT) 14.

FIG. 3 illustrates a top view where pin tips are protruding for engagement with contact pads of DUT. FIG. 2 illustrates a bottom view, with load board removed, but showing the bottom leg 22 of contact pins.

Figure 4:
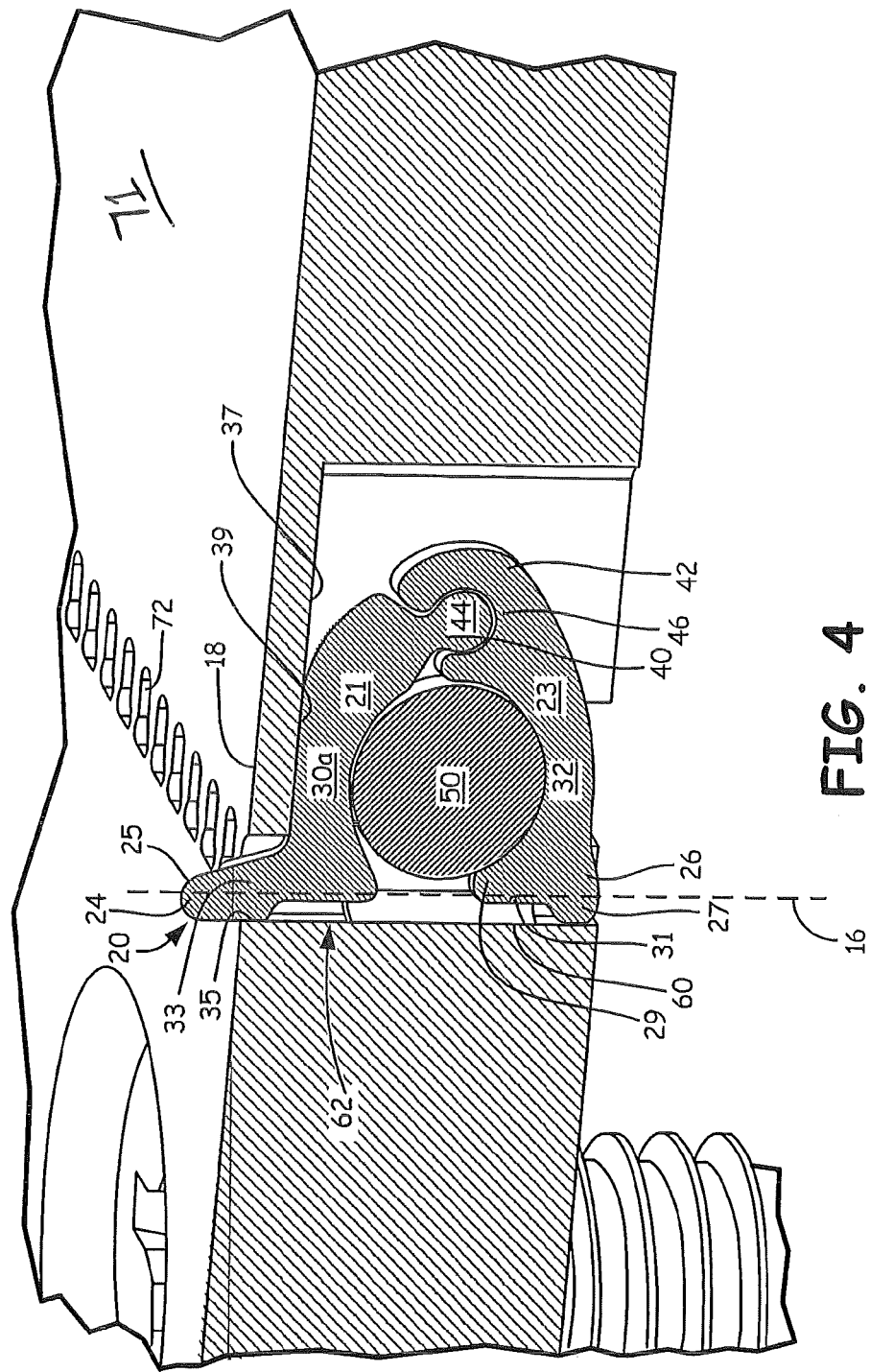
FIG. 4 is a side perspective sectional view of a single test pin pair and elastomer within a pin guide.

FIG. 4 provides a view of pin pair 20 having an upper leg 21 and lower leg 23. Lower leg 23 terminates in a contact end 26 which establishes electrical contact between the load board and the DUT pad (not visible).

Intermediate the distal ends 24, 26 of the pin pair 20, is an upper body portion 30 and lower body portion 32 which extend generally laterally from the distal ends 24, 26 and terminate at hinge parts 40, 42. In the embodiment as shown, the upper hinge part 40 has a ball 44 and the lower hinge part 42 has a ball receiver/socket hinge portion 46. Those two parts may be reversed and it should be understood that either arrangement is contemplated within the claims. Furthermore, the hinge need not be a ball/socket arrangement but includes a living hinge of conductive material or other rotational or flex joint. A living hinge for example, could include a thin bridging material which joins the legs and may even provide a bias force to maintain electrical contact with the load board/DUT. Note that the term "top", "bottom", "upper", "lower" are relative terms and are considered reversible depending on the viewer's point of view.

Upper and lower body portions 21, 23 extend generally laterally from tip 24 and lower contact pad 26. Most, i.e. a majority of, or even all of these lateral portions are offset from the above mentioned axis 16, preferably away from the DUT where there is more free area available. This offset allows the pins to be very thin yet have sufficient surface area to carry high currents and have likewise sufficient contact area within the hinge (ball and socket, for example) to have low resistance. The housing 12 has a plurality of spaced apart walls 18 which provide insulation and if made of metal over coated with an insulator, increase the frequency response of the pins.

Tip 24 includes a curved or pointed end 25, a generally vertically extending portion 33, which becomes upper body portion 30. Tip 24 also includes a generally vertical edge 35 which abuts wall 62, which constitutes the inner edge of the slot in which the pin resides. In FIGS. 10A-10B the tip is narrower than the thickness of the pin portion thereby creating a ledge 19

Figure 5:
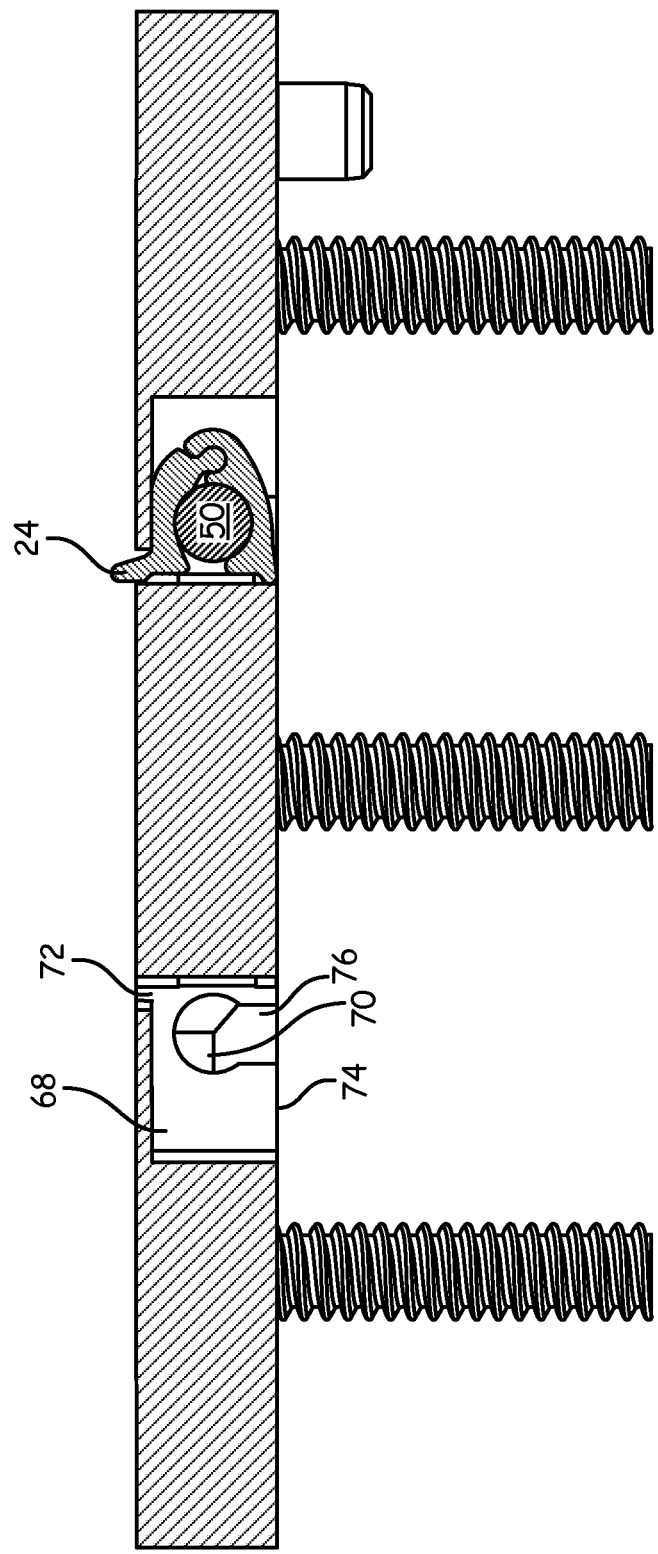
FIG. 5 is a side-view sectional plan view of an exemplary pin pair in its relaxed state.
Figure 6:
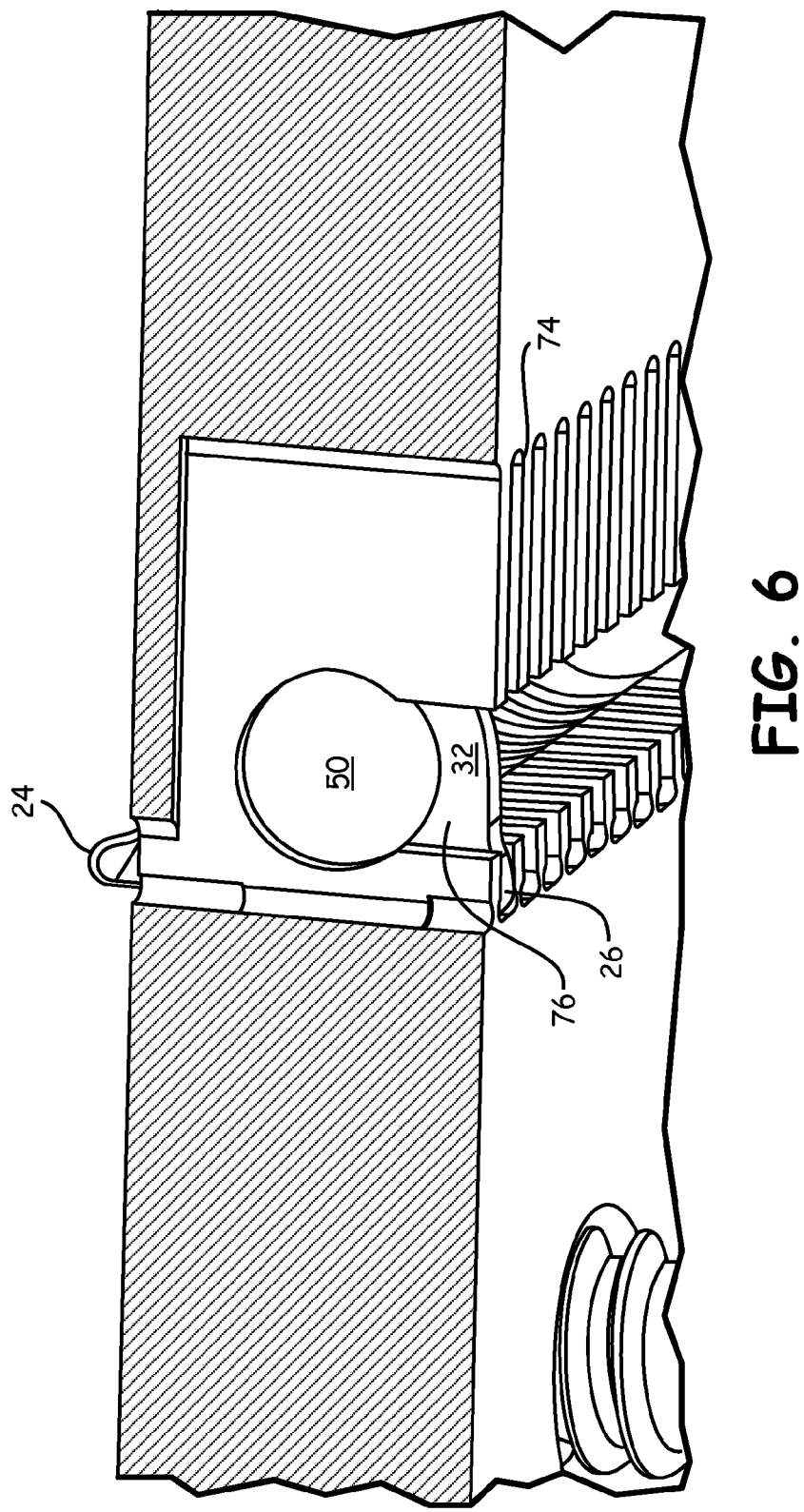
FIG. 6 is a side-sectional perspective view of the pin pair of FIG. 5, in a pin guide.
Figure 7:
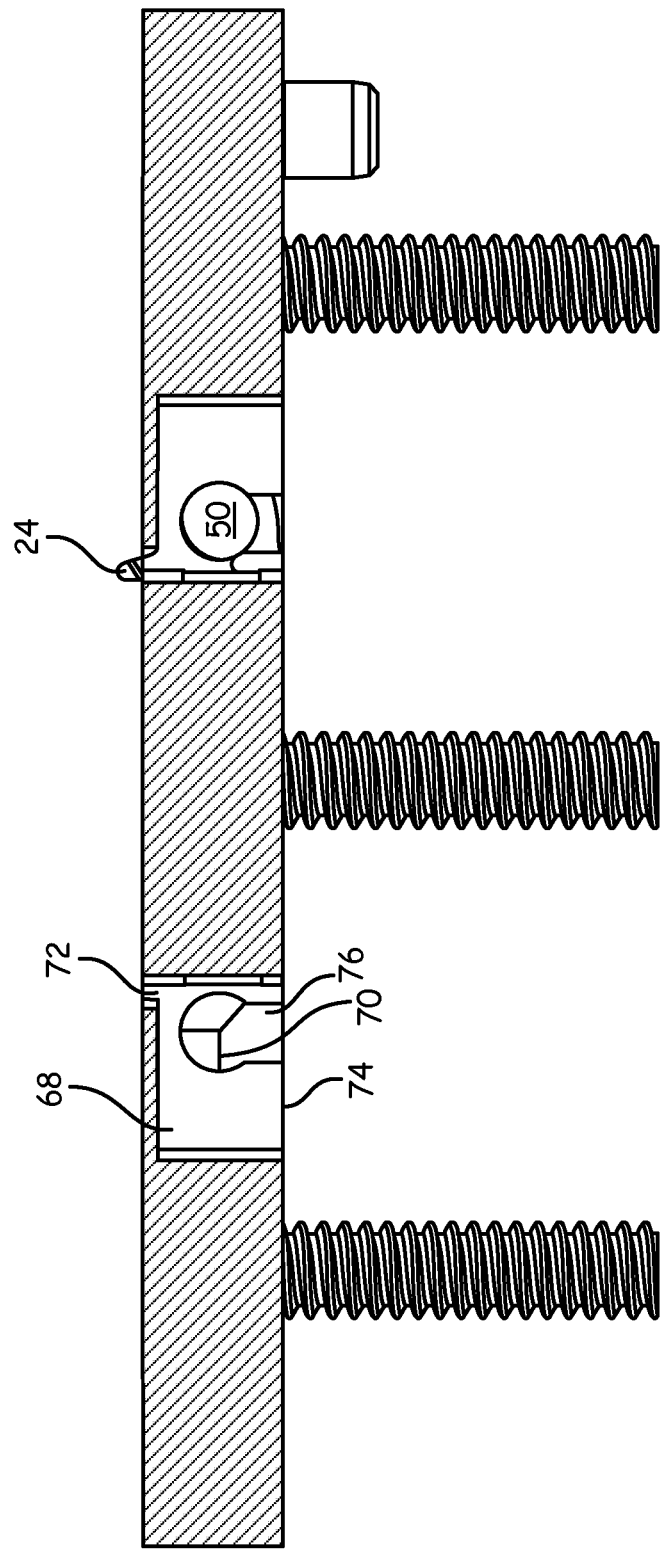
FIG. 7 is a section view of a pin guide, a pin pair and an unpopulated slot for a pin pair.

Lower contact pad 26 includes a foot 27 which protrudes from the slot 68 (FIG. 5) in the housing 12 to engage the pad on the load board under bias force of elastomer 50. Tip 26 also includes a generally vertically oriented portion 29 which has a flat sidewall 31 which butts up against and slides along wall 60 of the pin guide where the slotted portion ends. Alternative structures are also possible. For example instead of sidewall 31 being flat, it may be radiused or arcuate so that pin tip 24 slides along the corresponding DUT contact. This sliding action may be desirable as it wipes oxide off the DUT contact. The preferred slide or translation is 15% or less of the extent of the DUT contact.

Portion 30 of the upper leg 21 has a curved/semicircular profile to accommodate elastomer 50 which is preferably a tubular or cylindrical (i.e. structure with a central hole which may be independent for each pin or ganged together by bridging material at the top/bottom or elsewhere) elastomer sized to be received within a bore 70 (FIG. 5) in the pin guide. It may be two smaller diameter elastomers one atop the other or side by side or two half cylinders in abutment along their planar faces. The first and second elastomers may have different modulus of elasticity or compressive resistance so that the preloading force of the top and bottom legs may be different and adjusted according to desired parameters such has higher compressive resistance to the top leg relative to the lower, or vice versa.

The upper edge 39 of portion 30 is planar along the surface 37 that is engaged in the slot, which is likewise planar. This insures an accurate upstop/preload. In the preferred embodiment, the upper edge 39 becomes arcuate as it approaches the hinge.

Likewise, portion 32 of lower leg 21, 23 has a curved/semicircular profile to accommodate elastomer 50 which is preferably a tubular elastomer sized to be received within a bore 70 (FIG. 5) in the pin guide.

The elastomer 50 is thus partially enveloped by the legs of the pins.

Because of the hinge action between the legs, the pin parts have "independent suspension" so movement of the upper leg may be decoupled and may not generally cause significant movement in the lower leg. This is a significant advantage because it allows contact with the load board to be stable even when DUTs are moving in and out of contact with the upper legs during testing.

When lower contact foot 27 makes contact with the load board (and it is usually only once per installation), the foot deflects upwardly against the elastomer but very little movement is transferred into the upper leg.

Thus in DUT test operation, a DUT contact ball, pins or pad engages pin 24 driving it downwardly against elastomer 50. The movement is taken up in the hinge which may be generally halfway the distance between the upper and lower surfaces of the guide plate 71 (also referred to as the pin guide). The hinge maintains electrical continuity to the load board. Notice that at all times, the upper and lower contacts 24, 26 remain in alignment with axis 16 is required by the load board layout. Note that if the load board layout is allowed to deviate from the pogo pin type layout, the foot can be moved to another location along the lower leg as required. The same applies to the upper pin 24 which may be moved or translated to a part of the upper leg closer to the hinge.

Insertion of the pins into the housing first requires the guide plate/pin guide 71 (FIG. 4) to be formed or milled with slots between walls 18 which form insulating and separating plates between slots. The slots terminate in an upper aperture 72 and lower slots 74 which must be wide enough to accommodate the pin legs. A cross bore 70 (FIG. 5) must also be made generally through all slots 68 so that the elastomer reaches all pins. An access slot 76 is cut from the lower edge of the pin guide to bore 70 to permit insertion of the elastomer, which is preferably an elongate resilient tube/cylinder.

Figure 8:
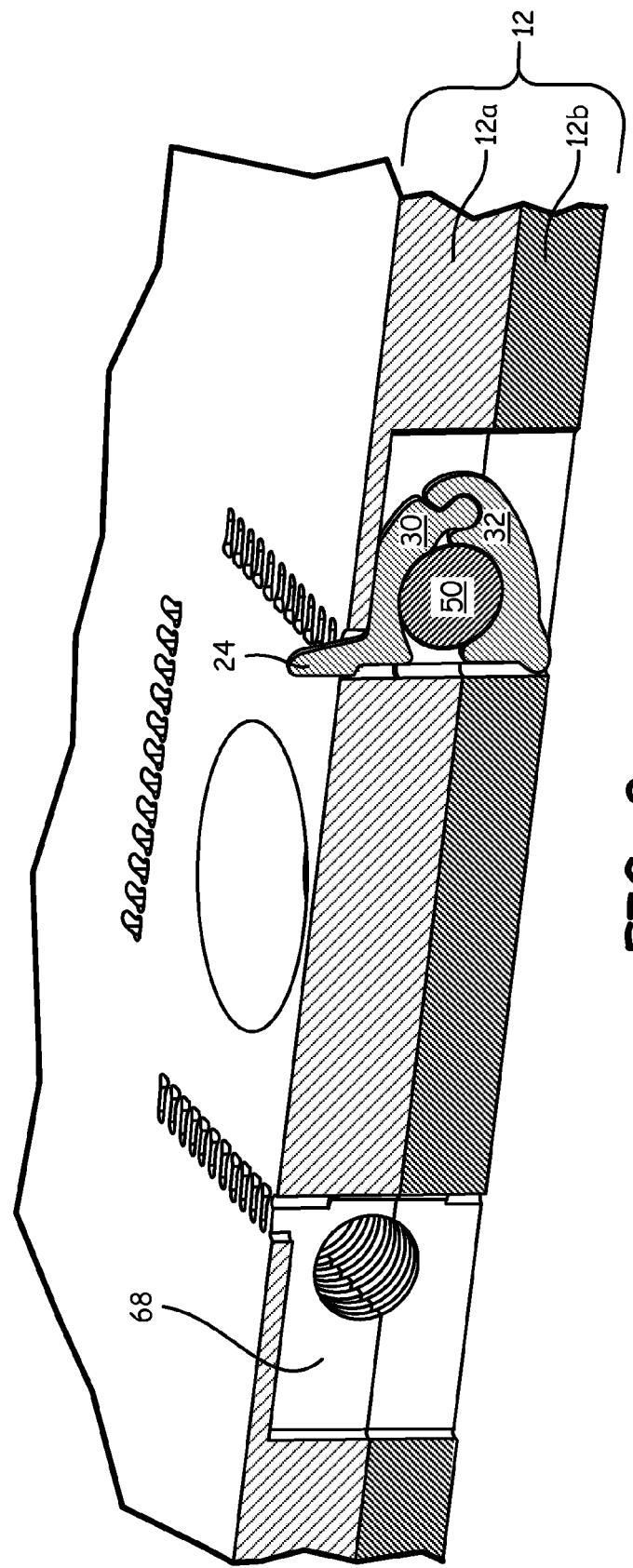
FIG. 8 is a top perspective view of the subject matter in FIG. 7 except with a two piece pin guide or housing.

Because of the difficulties in milling or forming such a slot, it is possible to form the housing 12, of upper and lower portions 12a, 12b as shown in FIG. 8.

Figure 9:
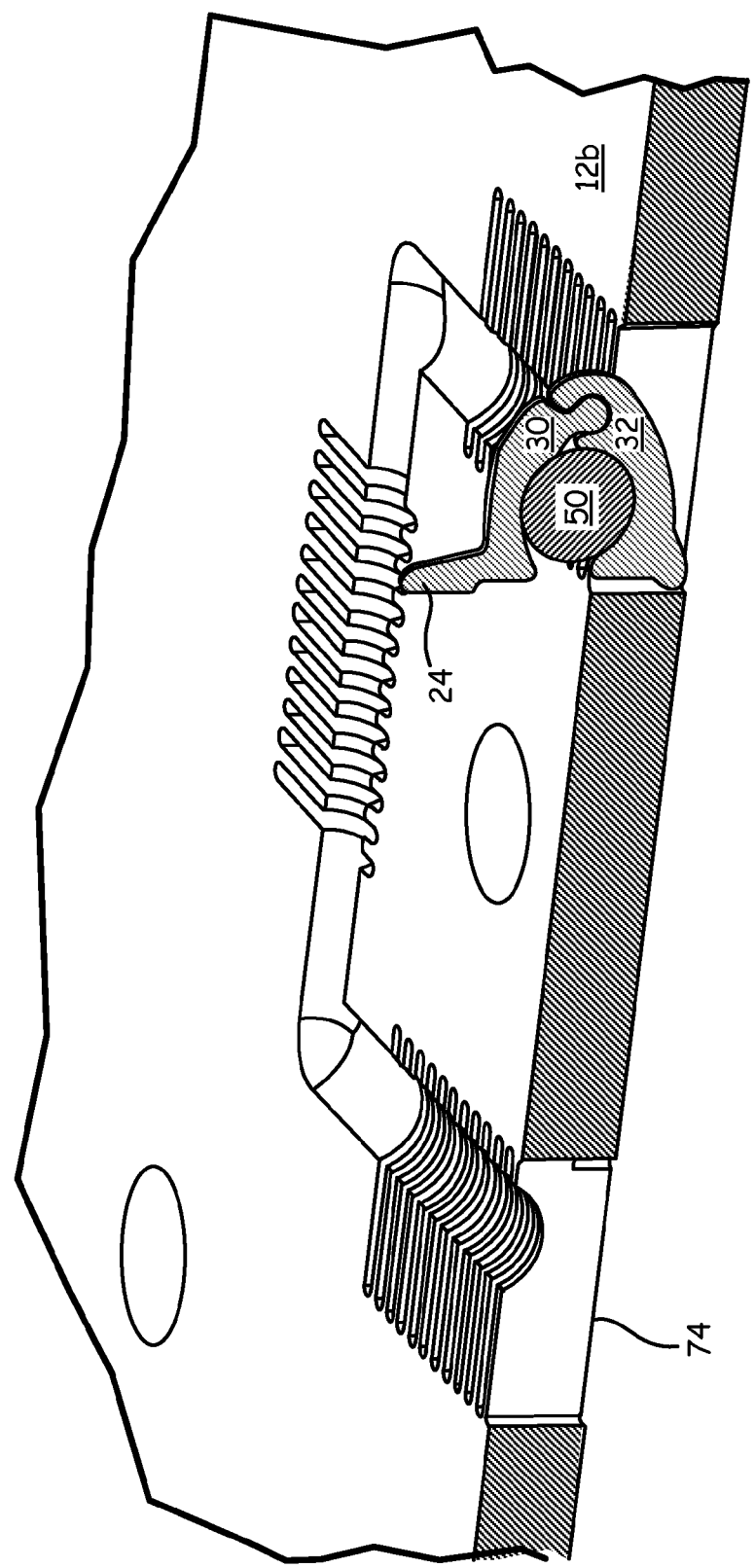
FIG. 9 is a view like FIG. 8 with the top portion of the pin guide housing removed.

The lower slot portion 12b is shown in FIG. 9 with the slots being spilt as shown.

Pin pairs 20 are shown in greater detail if FIGS. 10A, 10B. End 25 as shown, has narrower than the body, having a ledge 19.

Alternative embodiments are shown if FIGS. 11-19 and to the extent the elements in these embodiments are the same as above, the same reference numeral is used without further explanation. To the extent a reference numbers is concatenated with a letter (a, b) etc, this is an indication that the element is similar, to the like numbered element.

Figure 11D:
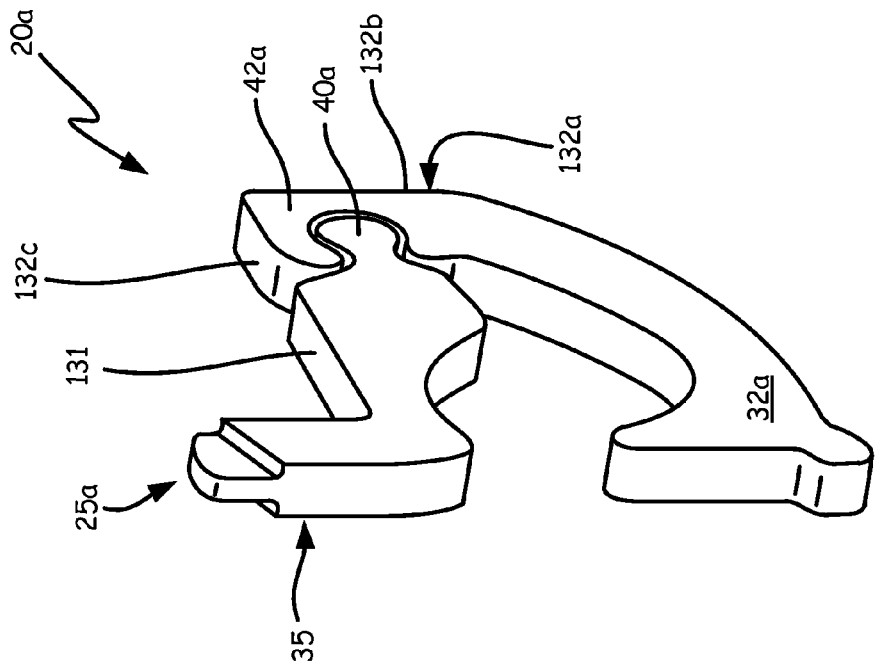
Figure 11C:
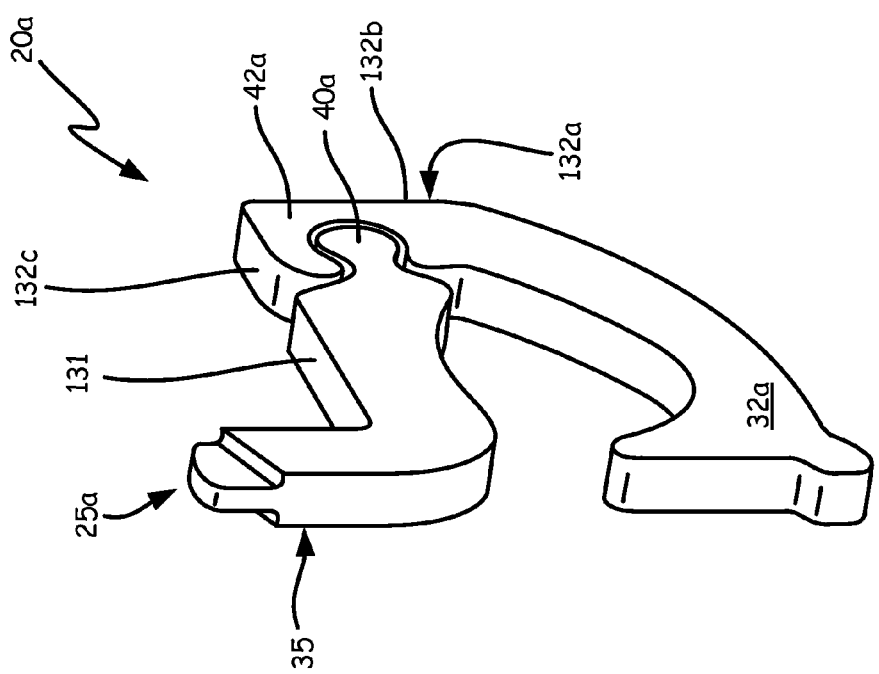
Figure 12B:
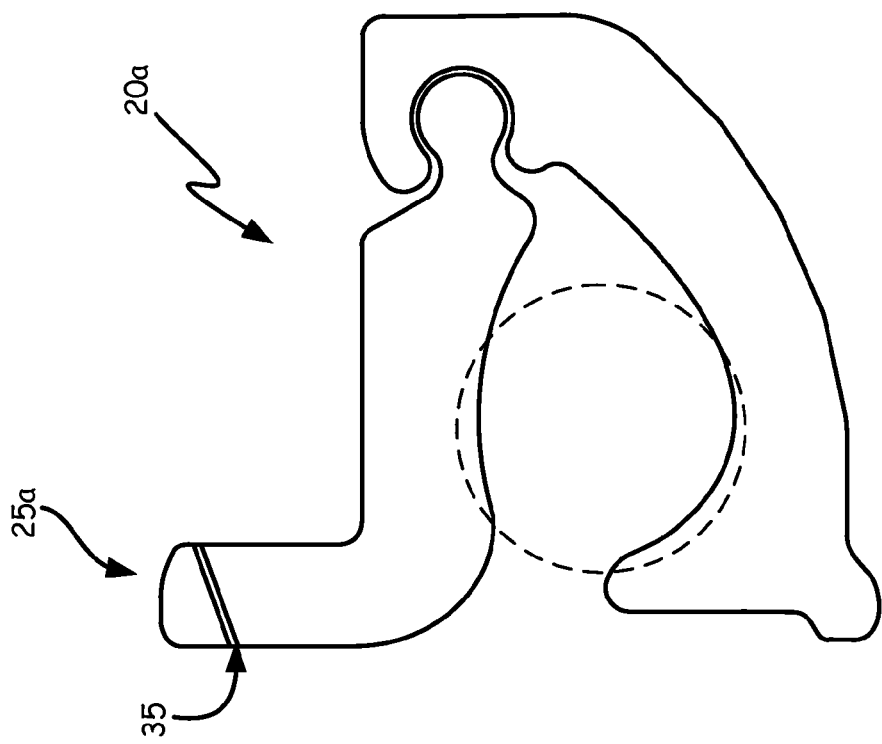
FIGS. 12A and 12B are side plans views of the pin pairs in FIGS. 11A-11B.
Figure 12A:
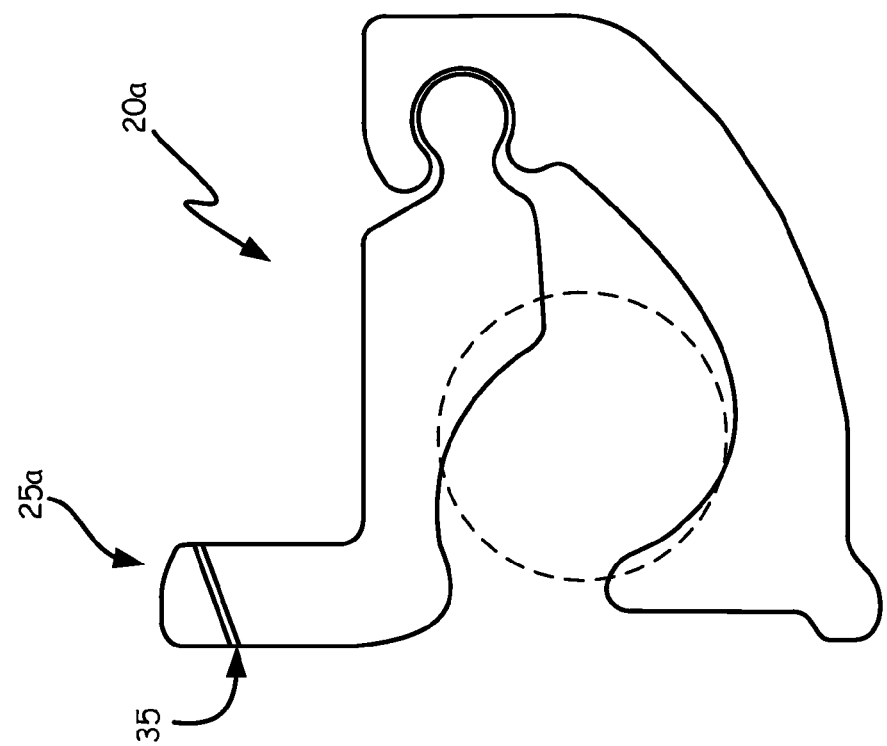
Figure 13D:
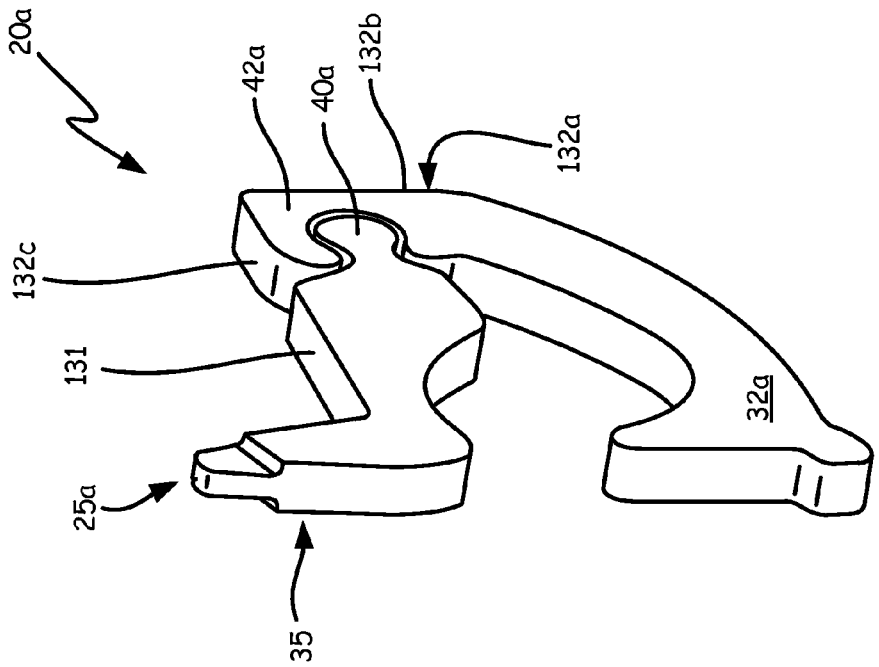
Figure 13C:
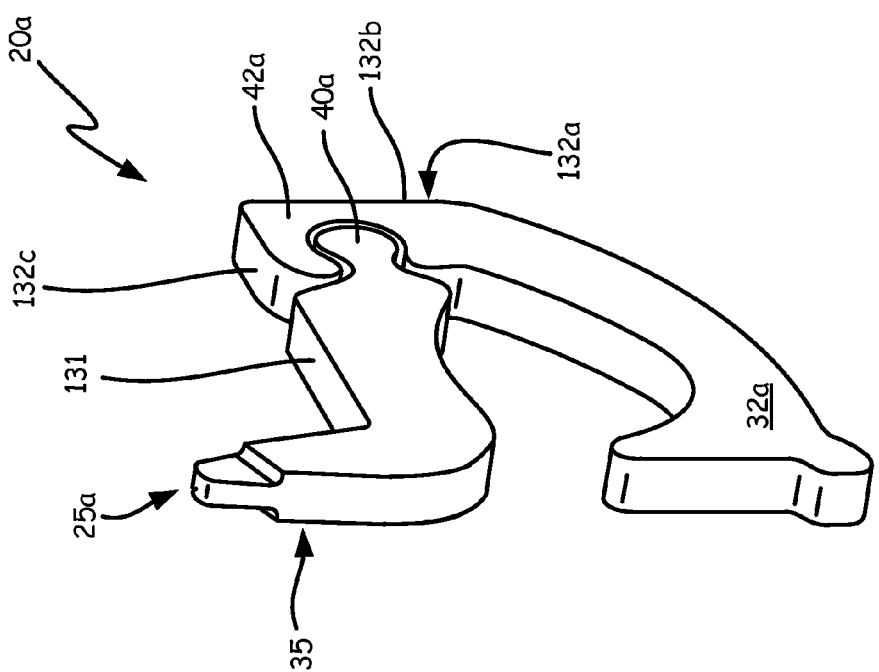
Figure 14B:
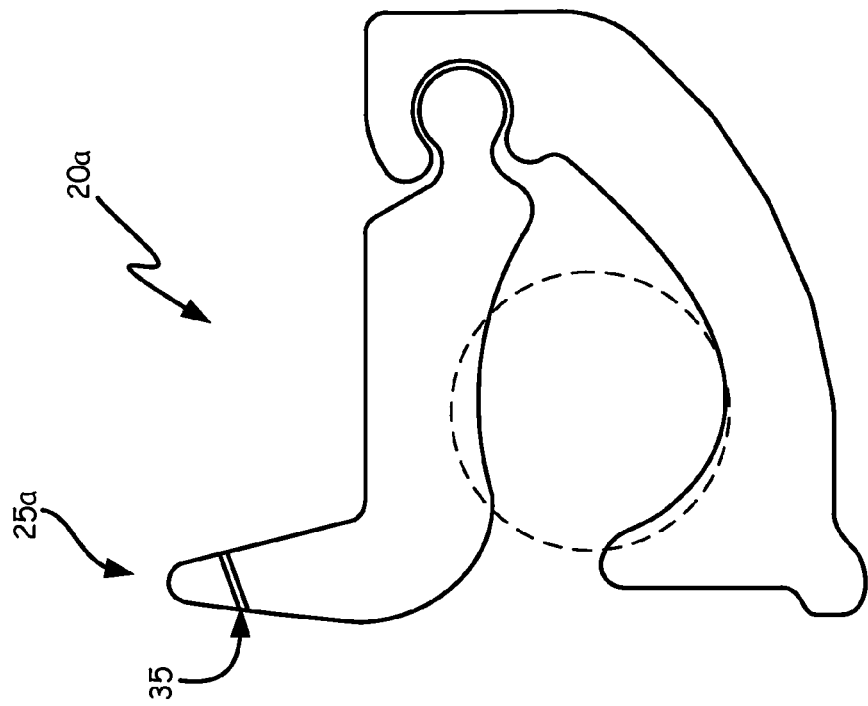
FIGS. 14A and 14B are side plans views of the pin pairs in FIGS. 13A-13B.
Figure 14A:
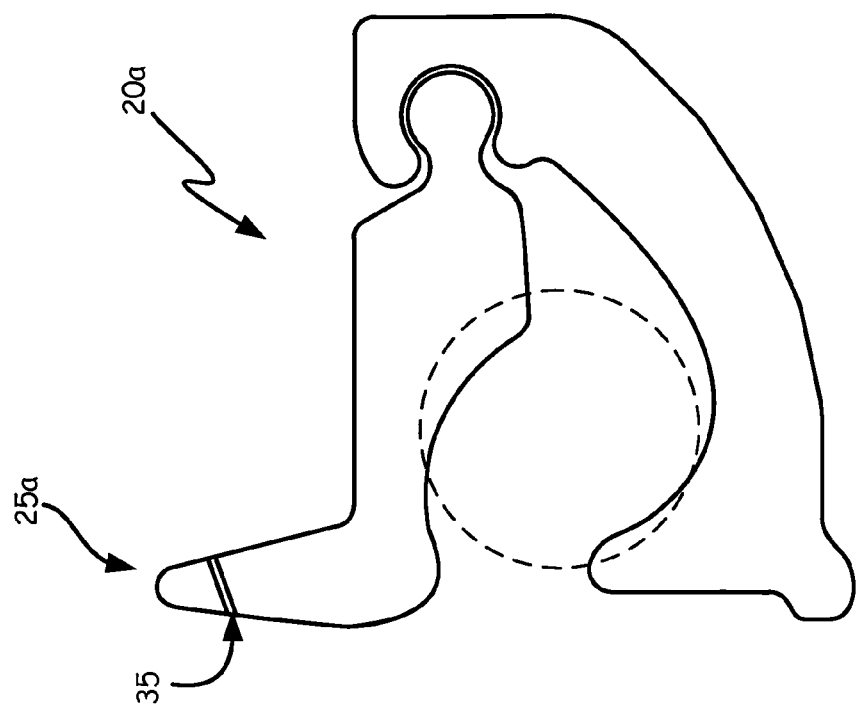

Embodiments in FIGS. 11A-11B illustrate a modification which is intended to minimize wear on the housing. In broad terms, by fixing the lower portion of the pin 32a by anchoring it between walls the housing 62a, 63a (FIG. 16), the lower portion 32a is largely prevented from moving even whilst the upper pin portion 30a is free to move on hinge 40a.

Figure 16:
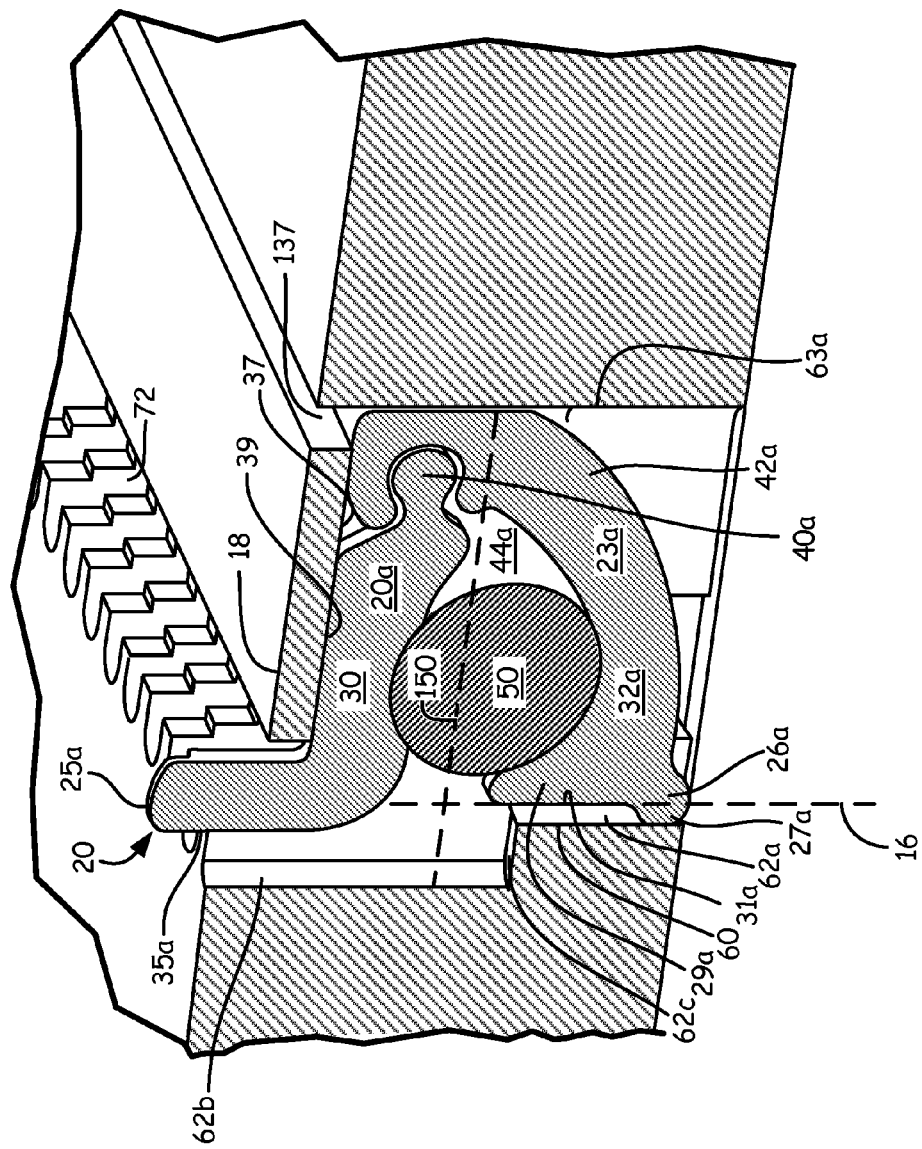
FIG. 16 is a side perspective elevational view like FIG. 4 except directed the embodiments in FIGS. 11 and 13.
Figure 17:
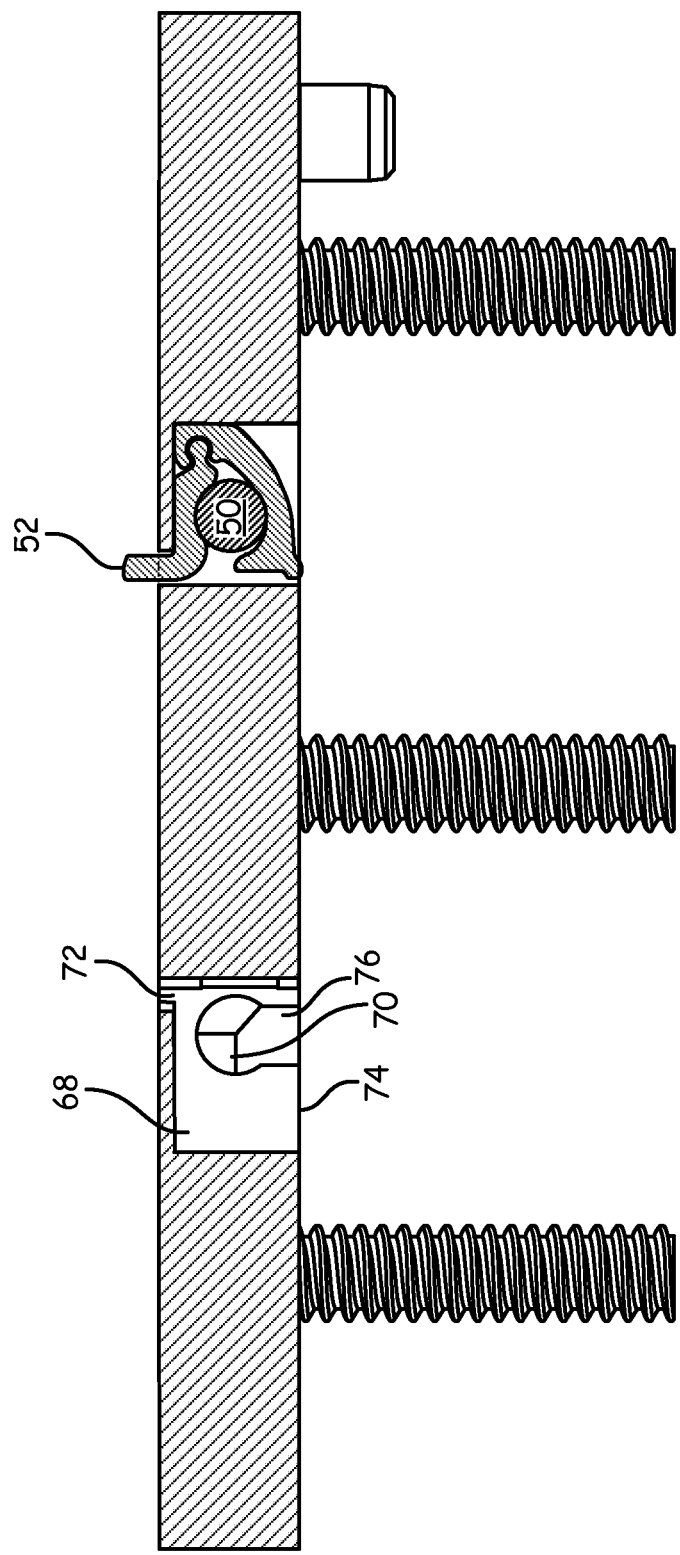
FIG. 17 is a view like FIG. 5 except directed to the embodiments shown in FIG. 11

FIGS. 11A, 11B and 16 provides a view of pin pair 20a having an upper leg 21a and lower leg 23a. Lower leg 23a terminates in a contact end 26a which establishes electrical contact between the load board and the DUT pad (not visible). End 26a (as well as 26) and foot 27a extend downwardly and forwardly to form an anchor point for leg 23a in a lower corner of the housing wall 60. As show, by virtue of the protrusion of end 26,26a, there is a gap between the remainder of the lower leg and wall 60. This minimizes wear but in the preferred embodiment, foot 27a engages wall 60 so as to create an anchor point for the lower portion 32a.

Intermediate the distal ends 24a, 26a of the pin pair 20a, is an upper body portion 30a and lower body portion 32a which extend generally laterally from the distal ends 24a, 26a and terminate at hinge parts 40a, 42a. In the embodiment as shown, the upper hinge part 40a has a ball 44a and the lower hinge part 42a has a ball receiver/socket hinge portion 46a. Those two parts may be reversed and it should be understood that either arrangement is contemplated within the claims. Furthermore, the hinge need not be a ball/socket arrangement but includes a living hinge of conductive material or other rotational or flex joint. A living hinge for example, could include a thin bridging material which joins the legs and may even provide a bias force to maintain electrical contact with the load board/DUT. Note that the term "top", "bottom", "upper", "lower" are relative terms and are considered reversible depending on the viewer's point of view.

Upper and lower body portions 21a, 23a extension generally laterally from tip 24a and lower contact pad 26a. Most, i.e. a majority of, or even all of these lateral portions are offset from the above mentioned axis 16, preferably away from the DUT where there is more free area available. This offset allows the pins to be very thin yet have sufficient surface area to carry high currents and have likewise sufficient contact area within the hinge (ball and socket, for example) to have low resistance. The housing 12 has a plurality of spaced apart walls 18 which provide insulation and if made of metal over coated with an insulator, increase the frequency response of the pins.

Unlike the prior embodiments, lower body portion 32a extends in contact with sidewall 63a of the housing. Portion 32a including a generally vertically oriented portion 132a which has a generally planar portion 132b which mates with wall 63a. Likewise portion 132a includes a horizontally oriented wall 132c which may abut housing wall 37 though abutment is not shown, it is preferred. Also located in wall 37 is an optional portal 137 which is desirable for manufacturing but could also be used to allow for calibration of the abutment point and consequently the motion of the pin pair. Insertion of a pin (not shown) can adjust the abutment point up or down. Consequently, the lower portion 32a is effectively wedged or confined from rocking motion by engagement with walls/60, 62a and 63a thereby.

Hinge part 40a is preferably located above a center/midline 150 which passes through the center of the elastomer 50. The pivot point/hinge is thus higher than in the previous embodiment and all or nearly all movement is confined to the upper arm portion 30a.

The upper body portion 30a as shown in FIGS. 11-14, has generally planar horizontal section.

Tip 25a is shown only schematically in FIG. 16, but in greater detail in FIGS. 11-14 includes a curved or pointed end 25, a generally vertically extending portion 37, which becomes upper body portion 30. Tip 25a also includes a generally vertical edge 35 is spaced from wall 62a, which constitutes the inner edge of the slot in which the pin resides. In the embodiment shown in FIG. 13A-B, that edge is arcuate to provide additional clearance when the pin is depressed in response to contact with a DUT.

In FIG. 16, wall 62a is cut back to an offset position 62b a distance along set back ledge 62c. This cut away provides a path/clearance for tip 25a to move without its movement being blocked by the housing wall 60.

In order to allow for movement of the upper portion 30a when encountering a DUT14 clearance is provided in slot 72 between longitudinally spaced walls. When tip 25a is deflected downwardly, elastomer 50 is compressed and the hinge rotates, but for the most part lower portion 32 remains static, though it may move vertically along wall 63a and impart a small rocking action into end 26a, thereby breaking oxidation on the associated load board.

Also disclosed is a method of providing a resilient electrical contact between a device under test (DUT) having contacts and a load board with contact pads, said contacts and pads being aligned along an axis; and including a conductive pin pair having an upper leg with a tip, and a lower leg with a leg contact, each leg having body portion and a part of a hinge. The method includes any or all of the following steps in any order.

i. locating the pin pair between said contacts and pads, with the tip and leg contact in alignment with said axis so that they are also in line with their respective contacts;
ii. locating a portion of the said body portions offset from said axis, the portion includes an elastomer, lateral portions from the tip and leg contacts and a hinge therebetween;
iii. locating said hinge offset from said axis.

Also disclosed is a method of manufacturing a pin pair capable of pogo pin replacement (i.e. aligned top and bottom contacts along an axis), by cutting or stamping two pin portions out of an electrically conductive material, forming top and bottom contact tips in alignment with an axis, forming a hinge therebetween off the axis; and providing a bias element in the space between the upper and lower contacts (offset from the axis or not) to bias the tips away from the bias element.

The description above is presented in the environment of a test load board and a test IC. However, it is to be understood that the invention is not so limited in application, and that other uses of the test socket are anticipated and contemplated by the inventors. Thus, no limitation should be implied by the use of terms such as "test socket" or "load board." Rather, the invention may be used for any and all applications for which it is appropriate.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

We claim:

1. A socket for making electrical connection between an integrated circuit device under test (DUT) having a plurality of contacts and a load board having a plurality of contact pads so that a signal may be transmitted therebetween wherein said contact and its corresponding pad are generally vertically aligned along a contact axis, comprising:

a. a housing having a top and bottom, and a pin guide being interposed between said contacts and said pads and said pin guide including a plurality of spaced apart insulating and separating plates thereby defining a plurality of slots for receiving pin pairs; with said slots being generally at least partially axially aligned along said contact axis; said pin guide further including a longitudinal cylindrical bore substantially orthogonal to said axis and extending through at least some of said plates thereby creating a cavity for an elastomer;
b. a bias element, including an elongated elastomer sized to be received within said bore;
c. a multi-piece pin pair including:
   1. a first upper pin leg having a contact tip at its distal end, said contact tip configured to contact at least one of said plurality of DUT contacts, an upper body portion extending from said tip and a upper hinge part at its proximal end said upper hinge part including a semi-circular disk;
   2. a second lower pin leg having a load board contact portion at its distal end configured to contact at least one load board pad, a lower hinge part at its proximal end said lower hinge part including a semi-circular socket sized to receive said disk to create a flexible joint, and a lower body portion extending from said pad contact portion to said hinge part;
   3. said hinge parts being hingeably joined to make a rotational and electrical pivotable link contact therebetween,
   4. said upper body portion including curved inner periphery shaped to engage said elastomer;
   5. said lower body portion including a curved inner periphery shaped to engage said elastomer;
   6. said contact tip and said load board contact on said pin pair being generally in axial alignment with said contact axis while said upper and lower hinge portions of said pin pairs are at least partially offset from said contact axis out of alignment with said contact axis, when said legs are contained within said slot.

2. A method of providing a resilient electrical contact between a device under test (DUT) having contacts and a load board with contact pads, said DUT contacts and load board pads being aligned along a contact axis; and including a conductive pair of pins including an upper leg with a tip said tip being aligned on said contact axis, and a lower leg with a leg contact, the upper leg having a body portion and a hinge portion, the lower leg having a body portion and a hinge portions, the two hinge portions together forming a hinge between the leg portions, comprising the steps of:

a. locating a portion of pair of pins between said contacts and pads, with said tip and leg contact in coaxial alignment with said contact axis;
b. locating a portion of the said upper and lower body portions laterally offset from said contact axis;
c. locating said hinge laterally offset from said contact axis; thereby locating a substantial portion of the legs and all of the hinge portions laterally away from the contact axis;
d. biasing said legs apart from each other so that the top and leg contact achieve electrical contact with said DUT and load board.

3. A socket for making electrical connection between an integrated circuit device under test (DUT) having a plurality of contacts and a load board having a plurality of contact pads so that a signal may be transmitted therebetween wherein said contact and its corresponding pad are generally vertically aligned along a contact axis, comprising:

a. a housing having a top and bottom, and a pin guide being interposed between said contacts and said pads and said pin guide including a plurality of spaced apart insulating and separating plates thereby defining a plurality of slots for receiving pin pairs; with said slots being generally at least partially axially aligned along said contact axis; said pin guide further including a longitudinal cylindrical bore substantially orthogonal to said axis and extending through at least some of said plates thereby creating a cavity for an elastomer;

b. a bias element, including an elongated elastomer sized to be received within said bore;

c. a multi-piece pin pair including:
   1. a first upper pin leg having a contact tip at its distal end, an upper body portion extending from said tip and a upper hinge part at its proximal end;
   2. a second lower pin leg having a load board pad contact portion at its distal end, a lower hinge part at its proximal end, and a lower body portion extending from said pad contact portion to said hinge part;
   3. said hinge parts being hingeably joined to make a rotational and electrical pivotable link contact therebetween,
   4. said upper body portion including curved inner periphery shaped to engage said elastomer.

4. The socket of claim 1 wherein said hinge portion includes a socket portion having a receiver opening and a disk portion receivable within said socket, and wherein said disk includes a portion having a diameter less that the receiver opening, so that the disk may be removed through the receiver opening when oriented in a predetermined position.

5. The socket of claim 1 wherein said housing defines slots on the top and bottom thereof and wherein said housing further includes a removable plate covering at least one of said slots on the top, so that when said plate is removed, and said hinge is oriented in said predetermined position, said top pin leg may be removed without removal of said bottom pin leg.

\* \* \* \* \*